(12) United States Patent
Austin

(10) Patent No.: US 6,215,713 B1
(45) Date of Patent: *Apr. 10, 2001

(54) BITLINE AMPLIFIER HAVING IMPROVED RESPONSE

(75) Inventor: James D. Austin, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/426,446

(22) Filed: Oct. 25, 1999

Related U.S. Application Data

(62) Division of application No. 09/060,932, filed on Apr. 15, 1998, now Pat. No. 5,982,690.

(51) Int. Cl.$^7$ .................................................. G11C 7/00
(52) U.S. Cl. ........................... 365/205; 365/207; 327/51; 327/52
(58) Field of Search .................................. 365/205, 207, 365/189.01; 327/51, 52, 50

(56) References Cited

U.S. PATENT DOCUMENTS

| 5,650,971 | * | 7/1997 | Longway et al. | 365/207 |
| 5,668,765 | * | 9/1997 | Ang | 365/205 |
| 5,696,726 | * | 12/1997 | Tsukikawa | 365/205 |

* cited by examiner

Primary Examiner—David Nelms
Assistant Examiner—Hoai V. Ho
(74) Attorney, Agent, or Firm—David L. Stewart; Peter T. Rutkowski

(57) ABSTRACT

A static, low-power differential sense amplifier (DSA) and method includes operation of cross-linked channels having complementary differential nodes separated from ground by corresponding parallel-transistor pairs. The DSA output channels have complementary output nodes separated from ground by corresponding parallel-transistor pairs. The DSA further includes logic gates to produce a sense amplifier output. Each logic gate is driven by a corresponding complementary differential node and an opposite complimentary output node. The DSA includes transistors activating a done line under control of the complementary differential nodes.

15 Claims, 6 Drawing Sheets

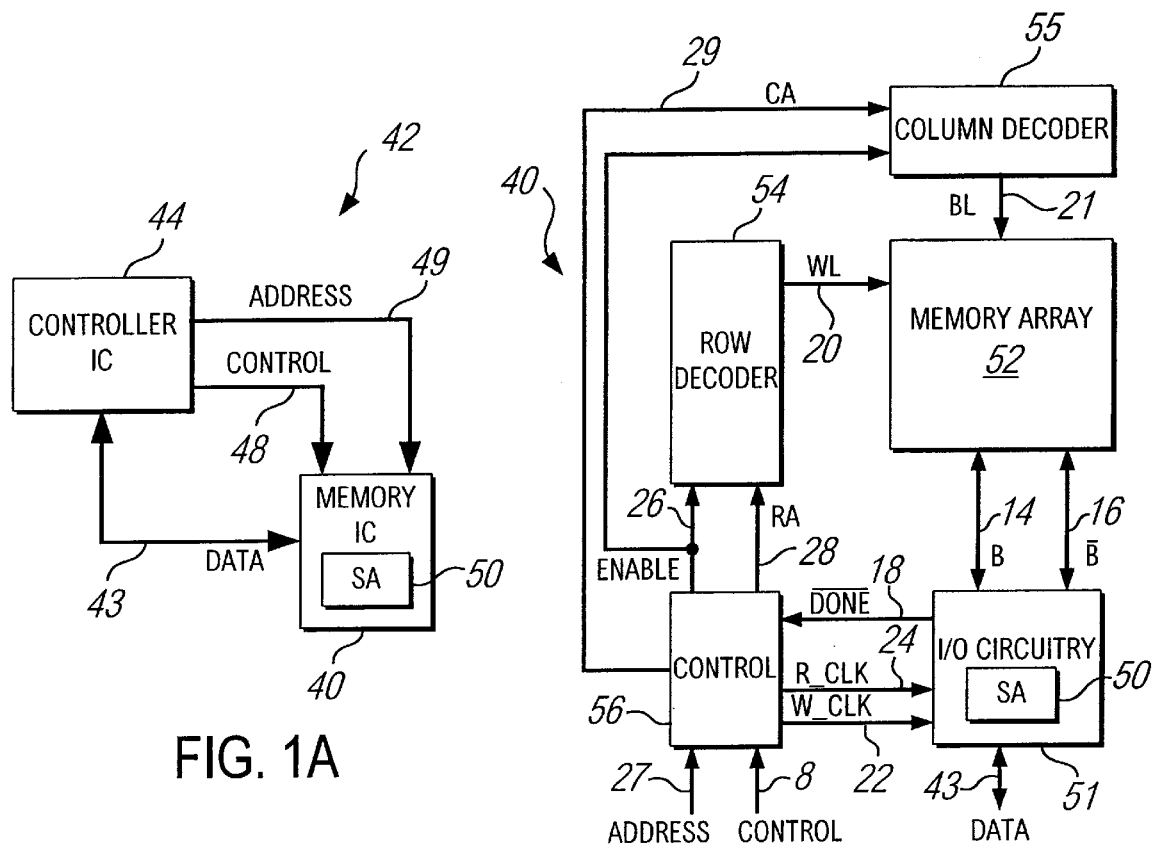
FIG. 1A
FIG. 1B
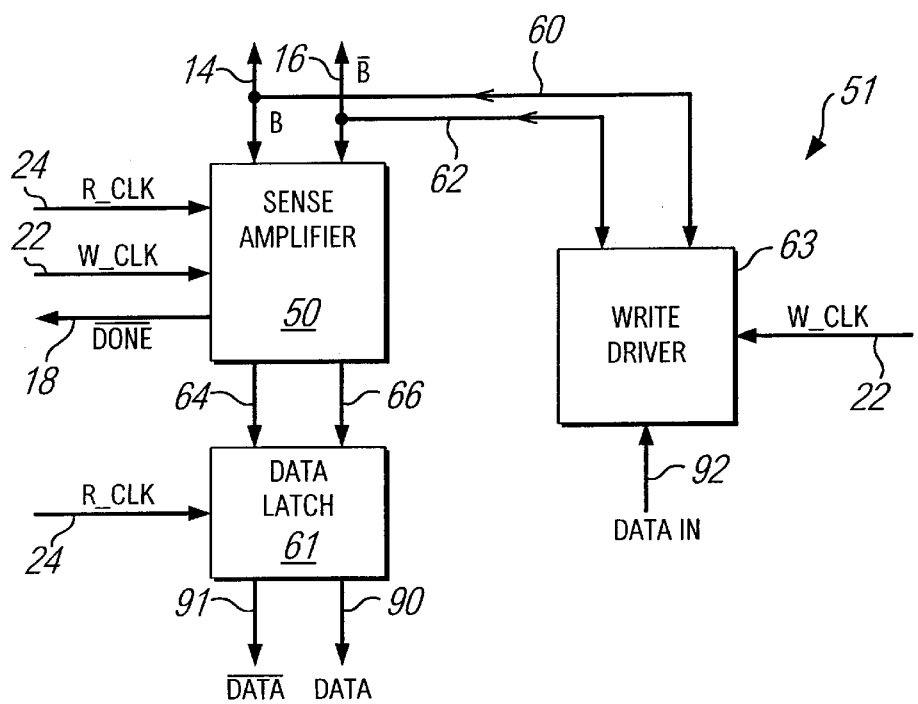
FIG. 1C

BITLINE AMPLIFIER HAVING IMPROVED RESPONSE

CROSS-REFERENCE TO RELATED APPLICATIONS

This application is a division of U.S. patent application, Ser. No. 09/060,932, filed Apr. 15, 1998 now U.S. Pat. No. 5,982,690, entitled, "STATIC LOW-POWER DIFFERENTIAL SENSE AMPLIFIER CIRCUITS, SYSTEMS AND METHODS."

BACKGROUND OF THE INVENTION

1. Field of the Invention

The field of this invention relates to circuits, systems and methods dealing with sense amplifiers and more particularly to circuits, systems and methods relating to static, low-power differential sense amplifiers.

2. Description of Related Art

Conventional semiconductor memories include memory cells arranged in one or more memory cell arrays. The memory cells are accessed by the user specifying particular row and column addresses. The row and column addresses cause selection of particular cells in the memory cell array subject to specified row and column addresses. The row and column addresses thus permit access to selected individual cells or groups of cells. The information stored in the selected cells may be output by a read operation or input by a write operation. A sense amplifier is activated in a read operation to sense information stored in particular memory cells and to provide an output signal indicative of that particular information content. This output signal may be provided to other circuitry within the memory device and ultimately to an external device which has requested the read information. Such an external device may for example be a data processing or computer system. Memory devices of the related art have in some cases required enable signals to control the timing of sensing operation performed by the sense amplifiers in a read operation. Such timing control requirements increase memory circuit complexity and consume increased amounts of silicon area required for layout and placement of memory device circuitry on a selected integrated circuit during fabrication. This increased silicon size creates technical difficulties and makes manufacturing more expensive, because the cost of memory devices is at least in part a function of silicon size.

Conventional static differential sense amplifiers moreover often consume excessive power and draw electric current beyond the power levels which optimize battery lifetime. This creates technical problems for mobile computer systems which need extended battery lifetimes. Excessive power consumption unfortunately decreases battery lifetime. The technical problems of excessive currents and high power consumption unfortunately diminish the commercial demand and the functionality of the associated static random access memories (RAMs) whether used in mobile computer systems or otherwise.

SUMMARY OF THE INVENTION

According to one embodiment of the present invention, an amplifier is connected to first and second complementary bitlines of semiconductor memory which carries selected information in particular memory cells. The amplifier according to this embodiment of the present invention comprises first and second control circuits which are connected to the first and second complementary bitlines to control the application of a first voltage according to the logical states of the bitlines. The amplifier further comprises first and second nodes which are connected to corresponding control circuits. Further, the amplifier comprises cross-coupled circuits connected to the control circuits, to produce output signals representative of information in particular cells of the semiconductor memory.

According to the present invention, a differential sense amplifier (DSA) includes first and second crosslinked sense amplifier channels having pull-up transistors and complementary differential nodes (CDNs) which are separated from ground by respective sense amplifier (SA) parallel transistor (PT) pairs. Prior to undertaking read operation, each of the complimentary differential nodes are set to a low logical state. Each channel of the DSA according to one embodiment of the present invention includes a pair of series connected transistors, one of the series connected transistors being controlled by an input bitline or its complement, and the other of the series connected transistors according to one embodiment of the present invention being controlled by a read enable signal provided over a read line. The differential nodes are linked to one of the transistors of the PT pair of the opposite channel (i.e., the linking transistor), so that when a particular differential node goes high, its complementary differential node is ground connected through the particular linking transistor to produce a complementary low at the complementary differential node. Further according to the present invention, the DSA includes first and second output channels having complementary output nodes (CONs) which are separated from ground by respective parallel transistor (PT) groups, each PT group being controlled at one of its transistors by a corresponding one of the complementary differential nodes of the first and second crosslinked channels. The DSA according to one embodiment of the present invention further includes first and second logic gates (LGs) to produce a differential sense amplifier output. Each of the respective LGs according to this embodiment is driven by a corresponding one of the CDNs and an opposite one of the CONs. According to another embodiment of the present invention, the DSA includes first and second control transistors connected to a done line and respectively activated by corresponding ones of said CDNs. The done line indicates completed performance of sensing operation by the DSA. In accordance with the present invention, a self-timed sense amplifier for a memory device generates a completion signal to indicate when a read or write operation has been completed and does not require an enable signal to time its sense operation. In addition, a memory device according to one embodiment of the present invention includes control circuitry connected to the self-timed sense amplifier. In a further embodiment, the memory device may include latch circuitry connected to the self-timed sense amplifier such that the memory device draws little static current and provides reduced power consumption during operation. The present invention further includes a corresponding method for accessing memory cells within an array of memory cells.

BRIEF DESCRIPTION OF THE DRAWINGS

FIG. 1 is a block diagram of a memory system configured to include sense amplifier circuitry according to the present invention.

FIG. 1B is a block diagram of an integrated circuit (IC) memory device configured to include sense amplifier circuitry according to the present invention.

FIG. 1C is a block diagram of input output circuitry configured to include sense amplifier circuitry according to the present invention.

DETAILED DESCRIPTION OF A PREFERRED MODE

Figure 1D:
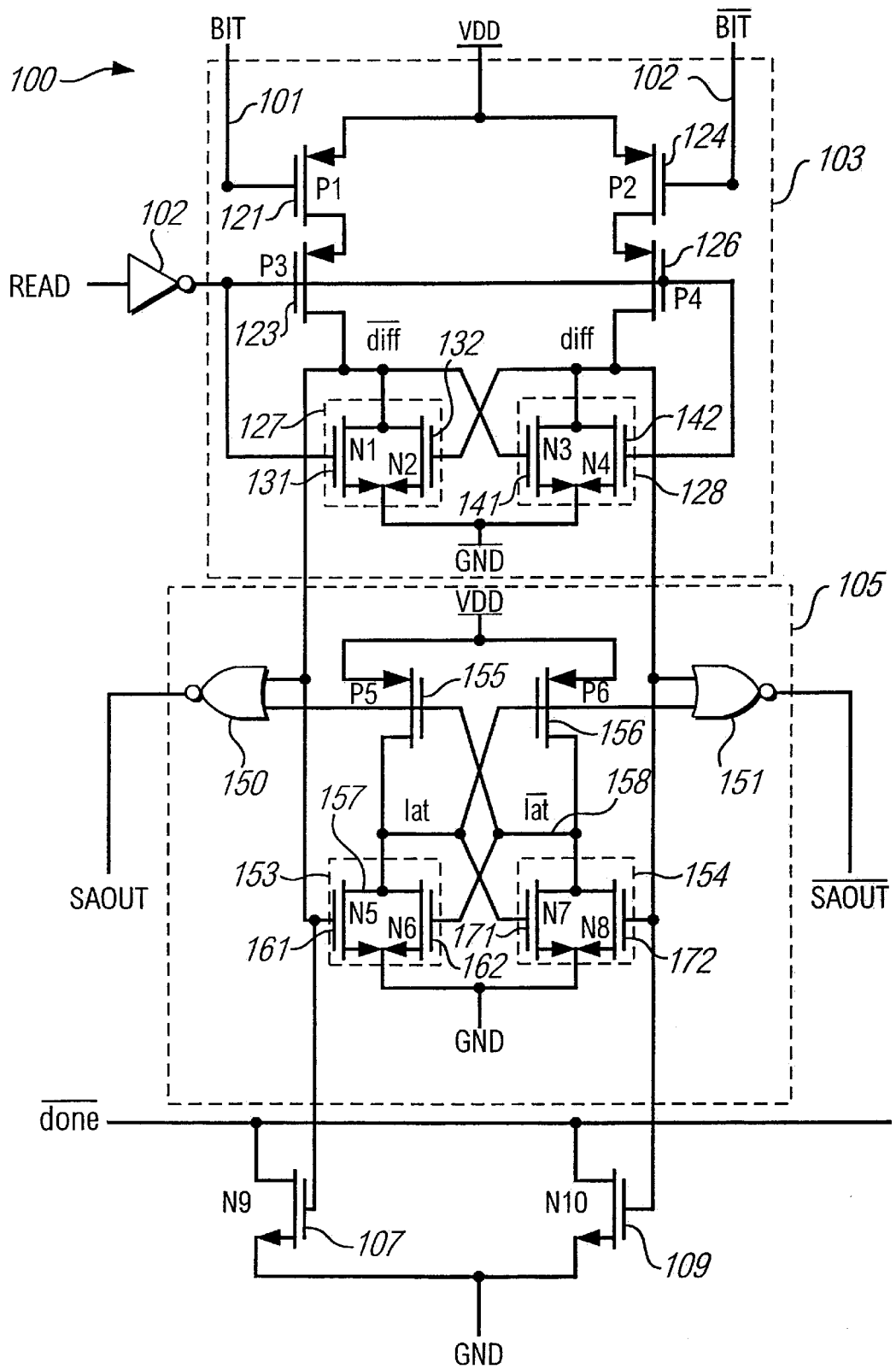
FIG. 1D is a circuit diagram of a differential sense amplifier system (DSAS) according to the present invention.

Referring now to FIG. 1A, a block diagram of a memory system 42 is shown including a sense amplifier (SA) 50 configured according to the present invention. Memory system 42 particularly includes data lines 43, an integrated circuit (IC) memory device 40, an IC controller 44 connected to IC memory device 40, control lines 48, and address lines 49. The IC controller 44 communicates with IC memory device 40 through control lines 48 and address lines 49. In addition, data lines 43 allow IC controller 44 to write data to and read data from the IC memory device 40. The control lines 48 may carry a variety of control signals, including for example a clock signal, a chip enable signal, a read signal, and a write signal. As is well-known, the IC controller 44 and the IC memory device 40 each include a plurality of external pins for communication through lines connected to these external pins.

Referring now to FIG. 1B, there is shown a block diagram of an embodiment of IC memory device 40 including a sense amplifier 50 configured according to the present invention. Memory device 40 further includes input output (I/O) circuitry 51 and a memory array 52 which in turn includes a matrix of memory cells, for example, static random access memory (SRAM) cells or dynamic random access memory (DRAM) cells. Memory device 40 further includes a row decoder 54 and a column decoder 55 which are connected to the memory array 52 through a word line (WL) 20 and a bit line (BL) 21. Memory device 40 further includes control circuitry 56 for controlling operation of row decoder 34, column decoder 55, and input output circuitry 50. WL 20 and BL 21 allow for a particular memory cell or selected groups of memory cells to be accessed within the matrix of memory cells that make up memory array 52. Column decoder 55 and row decoder 54 receive control signals from control block 56. In particular, column decoder 55 receives a column address signal on a column address line (CA) 29, and row decoder 54 receives a row address signal on a row address line (RA) 28. In addition, both the column decoder 55 and the row decoder 54 receive an enable signal 26 from control block 6 at appropriate enable times. Control circuitry 56 is further connected to control lines 48 from the IC controller 54 as well as to the address lines 27. Information is read from or written to the accessed cell within the memory array 52 through a bit line pair including a bit signal line 14 and a $\overline{\text{bit}}$ (bit_bar) signal line 16. In the embodiment depicted, the memory cells within memory array 52 are static random access memory cells, although the present invention is not so limited and may be applied to other memory cell structures such as DRAM cells. In this case, bit signals on bit signal line 14 represent the data stored in or written to the memory cell selected within memory array 2, and the bit_bar signal on bit_bar signal line 16 represent the opposite logical value of the bit signals on bit signal line 14. The input/output (I/O) circuitry 51 according to the present invention receives information on the bit line pair and receives and sends data through data lines 43. The I/O circuitry 51 also receives a read clock signal (R_CLK) 24 and a-write clock signal (W_CLK) 22 from control circuitry 56. Finally, the I/O circuitry 51 provides a completion signal $\overline{\text{DONE}}$ (DONE_bar) 18 that represents when the I/O circuitry has completed reading from or writing to the contents of a cell from memory array 52 which has been accessed through bit line pair 14 and 16. In the embodiment shown, the column decoder 55 and the row decoder 54 access a single memory cell according to a word line (WL) signal 20 and a bit line (BL) signal 21. Accordingly, the memory array 52 provides a single bit through complementary bit lines 14 and 16. It is understood, however, that the memory array 52 could have more cells accessed within it for a particular command. In such a case, multiple sense-amp circuitry blocks are used for the extra cells being accessed.

FIG. 1C is a block diagram of I/O circuitry 51 including sense amplifier circuitry 50, data latch circuitry 61, and a write driver 63, according to the present invention. The sense-amplifier (SA) circuitry 50 is connected to data latch circuitry 61 through signals on signal lines 64 and 66. In particular, SA circuitry 50 receives a R_CLK signal 24 and a W_CLK signal 22 from control circuitry 56, and SA circuitry So further provides a DONE_bar signal on DONE_bar signal line 18 to the control circuitry 56 to indicate when a read or a write operation has been completed. The sense-amplifier circuitry 50 produces differential amplifier signals on SA signal lines 64 and 66 to represent the information that was stored on the memory cell accessed within memory array 52. In particular, signals on SA signal line 66 represents the contents of the memory cell accessed within memory array 52 and correlates to the bit signals on bit signal line 14. The signals on signal line 14 represent the complement of the contents of the memory cell accessed within memory array 52 and correlate to the signals on bit_bar signal line 16. The data latch circuitry 61 according to the present invention receives a read clock (R_CLK) signal on read clock signal line 74 and differential amplifier output signals on differential amplifier output signal lines 64 and 66. The data latch circuitry 61 outputs a data signal on data signal line 90 and a $\overline{\text{data}}$ (data_bar) signal on data_bar signal line 91. The data signals 90 on data_bar signal line correlate to the differential amplifier output signals on differential amplifier output signal line 66, and the data_bar signals 91 on data_bar signal line correlate to the differential amplifier_bar output signal 64. The data signals 90 and 91 ultimately connect to the data line 43 that is connected between the IC controller 44 and the IC memory device 40. The write driver 54 receives the W_CLK signal 22 and a data input signal 92. When a write command is initiated, the write driver 63 connects to the bit lines 14 and 16 through lines 60 and 62 to provide the information to be written into the memory cell accessed within memory array 52.

Referring now to FIG. 1D, there is shown a circuit diagram of a differential sense amplifier system (DSAS) 100 according to the present invention in which a quiet state before read operation begins is shown. In particular, DSAS 100 includes an inverter 102, a first sense amplifier stage (FSAS) 103, a second sense amplifier stage (SSAS) 105, and first and second pull-down transistors, respectively 107 and 109 (i.e., N9 and N10). FSAS 103 includes first and second pairs of series connected p-channel transistors, respectively transistors 121, 123 and 124, 126 (i.e., P1, P3, P2, and P4) connected between Vdd and respective first and second differential connections (DCs), $\overline{\text{diff}}$ and diff. The control gates of transistors 121 and 124 are coupled respectively to the bit and $\overline{\text{bit}}$ lines (i.e., 101 and 102) of DSA 100. Prior to the initiation of read operation, the bit and $\overline{\text{bit}}$ lines (i.e., 191 and 102) are precharged to Vdd. Between the respective first and second DCs and ground are connected first and second parallel connected (PC) transistor pairs 127 and 128, respectively. First PC transistor pair 127 includes first and second n-channel parallel-connected transistors 131 and 132 (i.e., N1 and N2) connected to ground. Second PC transistor pair 128 includes first and second n-channel parallel connected transistors 141 and 142 (i.e., N3 and N4) connected to ground.

SSAS 105 includes first and second p-channel transistors 155 and 156 (i.e., P5 and P6), first and second NOR gates 150 and 151, and third and fourth parallel connected (PC) transistor pairs 153 and 154, respectively. NOR gates 150 and 151 each have two input connections and one output connection. The output connections of NOR gates 150 and 151 act as the differential output signal source for the DSAS 100. Transistors 155 and 156 (PS and P6) are connected between Vdd and respective output connection nodes (OCNs) lat and $\overline{\text{lat}}$, respectively 157 and 158. PC pairs 153 and 154 are respectively connected between lat and $\overline{\text{lat}}$ (i.e., 157 and 158), and ground. Third PC transistor pair 153 includes first and second transistors 161 and 162 (i.e., NS and N60 connected to ground. Fourth PC transistor pair 154 includes first and second n-channel parallel connected transistors 171 and 172 (i.e., N7 and N8) connected to ground. Respective NOR gates 150 and 151 have respective complementary output connections saout and $\overline{\text{saout}}$. Differential connection $\overline{\text{diff}}$ is coupled to one input of NOR gate 150 and to the respective control gates of transistors 141, 161 and 107. The differential connection diff is connected to one input of NOR gate 151 and to the respective control gates of transistors 132, 172 and 109. During read operation, one of bitlines bit and $\overline{\text{bit}}$ (i.e., bitline 101 and bitline 102) discharges, as data from a differential memory cell flows through the applicable one of the bitlines 101, 102. The DSAS 100 according to the present invention accordingly has reduced power dissipation and requires no enable input nor an enable reference timing circuitry, permitting substantial circuit simplification to be achieved according to the present invention.

Figure 2A:
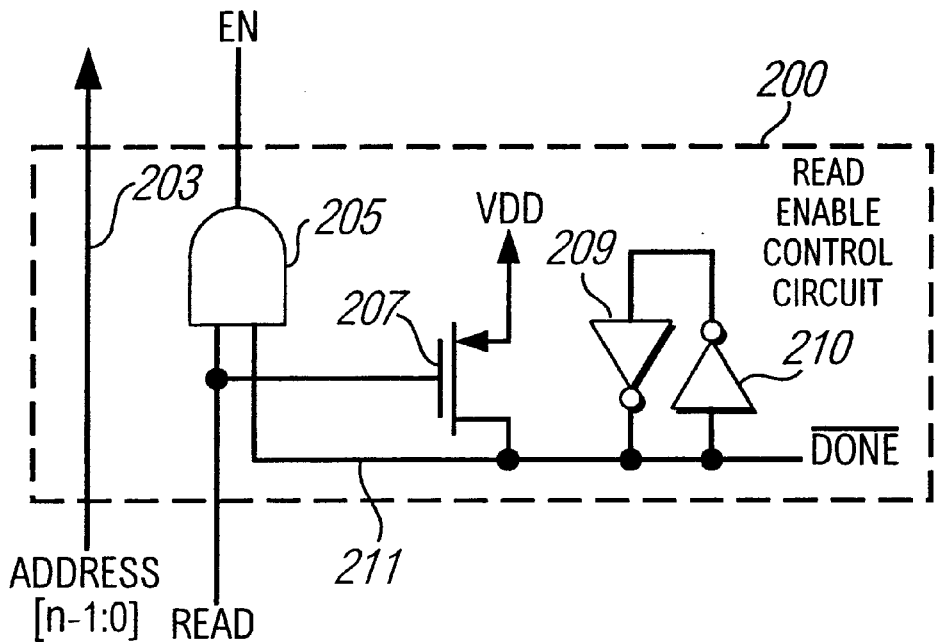
FIG. 2A is a circuit diagram of read enable control circuit (RECC) according to the present invention.

Referring now to FIG. 2A, there is shown a circuit diagram of read enable control circuit (RECC) 200 for a DSAS 100, according to one embodiment of the present invention. In particular, RECC 200 includes an address line 203; an AND gate 205 for producing an enable signal (EN); and a control transistor 207 for providing a Vdd pull-up in response to receipt of a read signal. RECC 200 further includes first and second inverters, respectively 209 and 210; and $\overline{\text{done}}$ line 211 which is connected as an input to AND gate 205. The remaining input to AND gate 205 is a read signal connection. The output connection of AND gate 205 accordingly produces an enable (EN) signal when a high logical value (i.e., Vdd) is resident on $\overline{\text{done}}$ line 211 and a logical state high read signal is received. The input side of inverter 210 and the output side of inverter 209 are connected to $\overline{\text{done}}$ line 211, while the output of inverter 210 is connected to the input of inverter 209. Address line 203 specifies the memory location of the data to be read subject to the read signal provided.

Figure 2B:
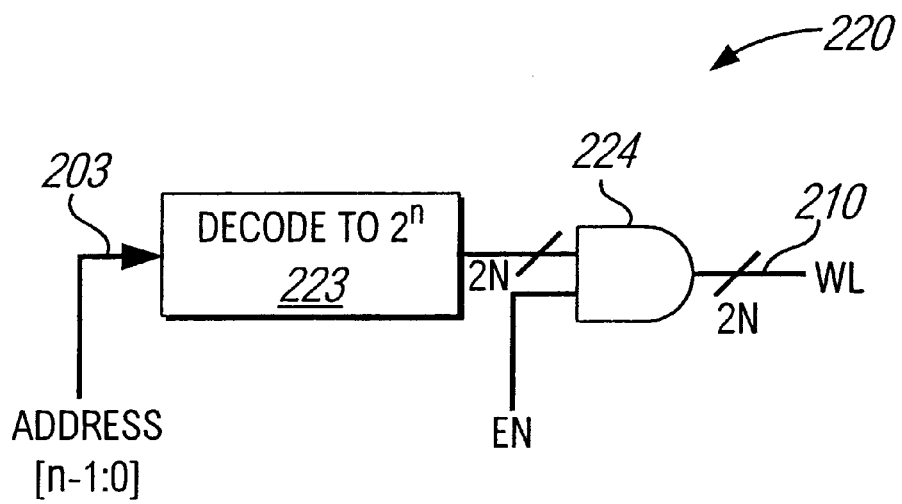
FIG. 2B is a circuit diagram of a wordline decoder according to the present invention.

Referring to FIG. 2B, there is shown a circuit diagram of a wordline decoder (WD) 220 according to the present invention. In particular, WD 220 includes an address line 263; an n-$2^n$ decoder 223 connected at its input to address line 203; and an AND gate 224 having first and second inputs which include an enable signal (ES) line and a $2^n$ wide input connected to output decoder 223, where n is a selected integer value. The wordline address signal output from AND gate 224 and from decoder 223 is $2^n$ bits wide. AND gate 224 accordingly provides a wordline (WL) output which is $2^n$ wide, when the AND gate 224 receives an enable (EN) input as for example from AND gate 205 shown in FIG. 2A.

Figure 3:
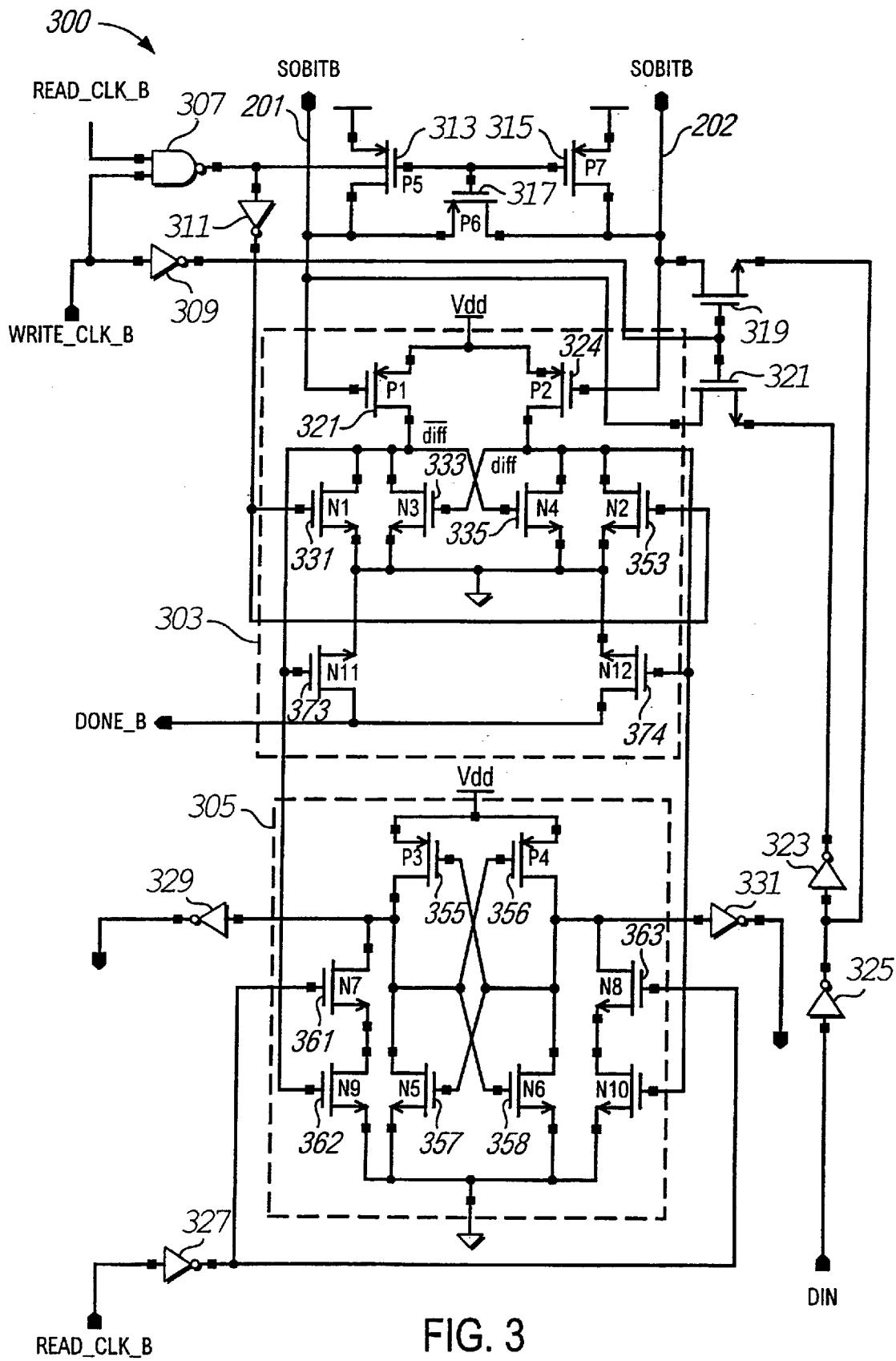
FIG. 3 is a circuit diagram of another differential sense amplifier system (DSAS) according to the present invention.

Referring now to FIG. 3 there is shown a circuit diagram of a differential sense amplifier system (DSAS) 300 according to another embodiment of the present invention. In particular, DSAS 300 includes complementary first and second bitlines 201 and 202; first and second sense amplifier stages (SAS), respectively 303 and 305; a NAND gate 307 (i.e., ND1) for write and read clock signals; a first inverter 309 for receiving a write clock signal; and a second inverter 311 for receiving the logical output of NAND gate 307 to provide read control signals to first SAS 303. DSAS 300 further includes first, second, third, fourth and fifth transistors 313, 315, 317, 319 and 321 (i.e., respectively P5, P7, P6, N13, and N14); and third, fourth, fifth, sixth, and seventh inverters, respectively 329, 327, 331, 323, and 325, which are connected respectively as follows to provide a sense amplifier output and a read signal as applicable. Transistors 313, 315 and 317 are used to precharge bitlines 201 and 202 to a high logical state prior to initiation of read operation. Transistors 319 and 321 provide differential data to respective bitlines 201 and 202 when enable through inverter 309 to conduct write operations. Third inverter 329 is connected to an output connection node of SAS 305 and produces one portion of a differential sense amplifier output signal, saout. Fourth inverter 327 provides a read clock signal for SAS 305 and is connected at its output to the control gates of transistors 361 and 363 (i.e., N7 and N8) to permit read operations according to the present invention. Fifth inverter 331 is connected to an output connection of SSAS 305 and produces an inverted (i.e., complementary) sense amplifier output $\overline{\text{saout}}$ for DSAS 300. Sixth inverter 223 is connected at its anode to fifth inverter 231, and then respectively to the control gates of write control transistors 319 and 321 (N13 and N14). When write control transistors 319 and 321 (N13, N14) are enabled by a write clock signal from inverter 309, complementary data signals are applied to the differential bitlines 201 and 202 to memory cells comprising a word of data, as described in greater detail below. The output of first inverter 209 is connected to the control gates of transistors 219 and 221 to enable performance of such data write operations. The same write clock signal is provided as an input to both NAND gate 307 and inverter 309 and is operative to prevent transistors 313, 315, and 317 from precharging the bitlines during write operation. Another input of NAND gate 307 is a read clock signal. According to the connection scheme shown in FIG. 3, precharging of bitlines 201 and 202 to a high logical state occurs when both read and write signals are low. The output connection of NAND gate 307 is coupled to the control gates of transistors 313, 315, and 317, respectfully, to enable and prevent precharging as required. First SAS 203 includes first and second sets of transistors in left and right differential channels, respectively transistors 321, 333, and 331 in the left channel (i.e., P1, N3, and N1); and transistors 324, 353, and 335, in a right channel (i.e., P2, N2, and N4) connected between Vdd and ground. SAS 303 further includes first and second n-channel transistors 373 and 374 (i.e., N11 and N12), which are connected to ground and controlled respectively by nodes $\overline{\text{diff}}$ and diff. Transistors 321, 333, and 331 (P1, N3, N1) are connected to each other at differential node $\overline{\text{diff}}$. Transistors 324, 353 and 335 (P2, N2, N4) are connected to each other at differential node diff. The output signal from inverter 211 is operative to turn on and off transistors 331 and 353 (N1 and N2), which selectively connects differential nodes $\overline{\text{diff}}$ and diff to ground. Second SAS 205 includes first, second, third, and fourth pairs of transistors respectively 355, 357 (i.e., P3 and N5); 356, 358 (i.e., P4 and N6); 361, 362 (i.e., N7 and N9); and 363, 364 (i.e., N8 and N10). Transistors 355, 357 and 361 (P3, N5, N7) are connected to each other at a first common node (i.e, a first of two complementary output nodes for SAS 300), to which the control gates of transistors 356 and 358 (P4, N6) are connected. Transistors 356, 358 and 363 (P4, N10, N8) are connected to each other at a second common node (i.e., a second of the complementary output nodes of SAS 300), to which the control gates of transistors 355 and 357 (P3 and P40 are connected. Transistor 357 (N5) is connected in parallel with series connected transistors 361 and 362 (N7 and N9). Similarly, transistor 358 (N6) is connected in parallel with series connected transistors 363 and 364 (N8 and N10). Transistor 355 (P3) is connected in series with parallel connected transistors 361, 362 (N7, N9), and 357 (N5), between Vdd and ground. Similarly, transistor 356 (P4) is connected in series with parallel connected transistors 363, 364 (N8 and N10), and 358 (N6), between Vdd and ground.

Figure 4:
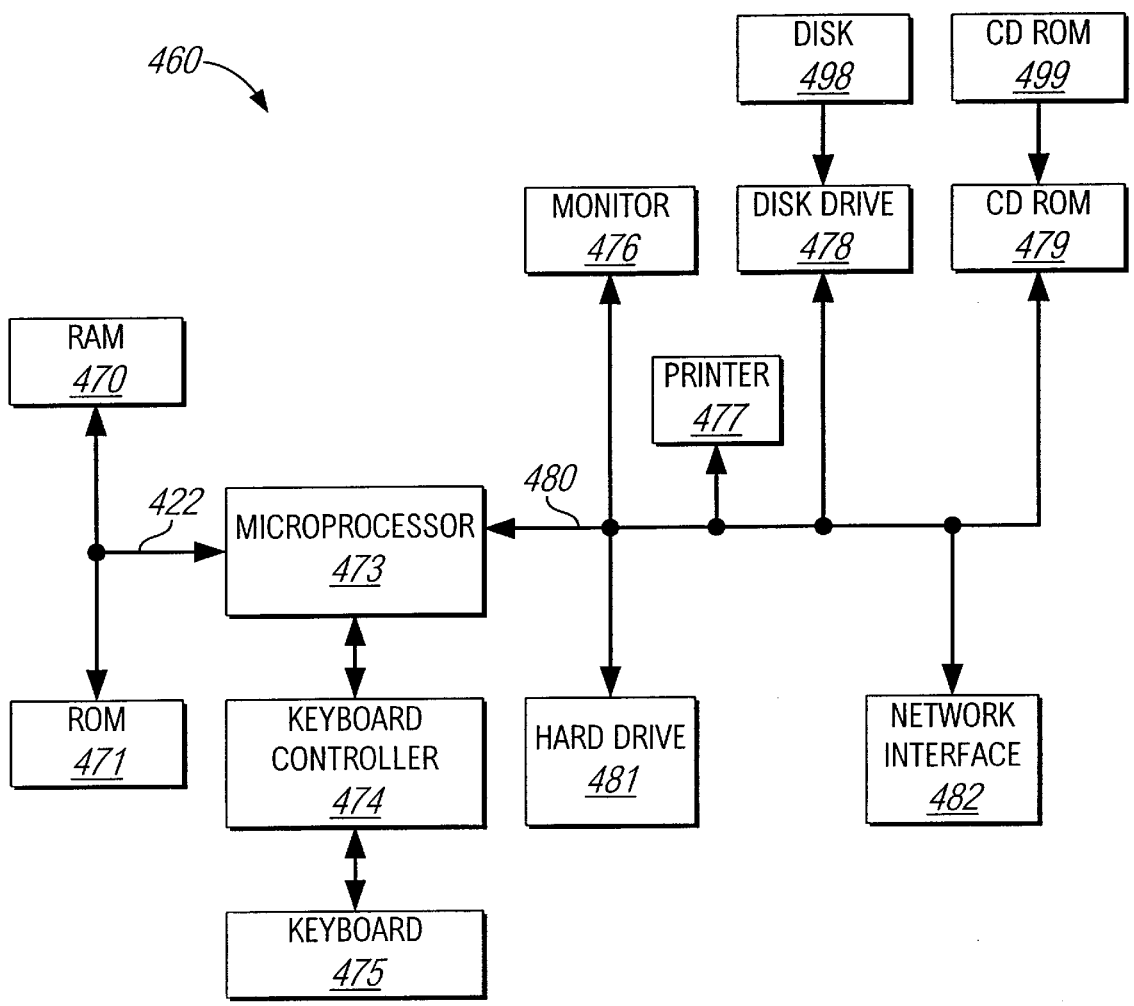
FIG. 4 is a block diagram of a computer system which includes a memory and a differential senses amplifier according to the present invention.

Referring now to FIG. 4, there is shown a block diagram of a computer system 460 which includes a random access memory (RAM) 470 and associated with RAM 470, a differential senses amplifier (not shown) according to the present invention. FIG. 4 is particularly a block diagram of a computer system 460 which can be used as a computer processing system for reading and writing data words in accordance with one embodiment of the present invention. Computer system 460 more particularly includes a random access memory (RAM) 470; a read only memory (ROM) 471; a memory bus 472 connected to RAM 470 according to the present invention and ROM 471; a microprocessor 473 connected to the memory bus 472; a monitor 476; a printer 477; a disk drive 478; a compact disk read only memory (CD ROM) drive 479; a peripheral bus 480 connected to monitor 476, printer 477, disk drive 478, and CD ROM drive 479; a hard drive 481; and a network interface, each connected to peripheral bus 480 as shown in FIG. 4. Disk drive 478 and CD ROM drive 479 are respectively able to read information including computer program products (not shown) which can be embedded on media such as, respectively, a magnetic or optical disk or floppy 498 and a CD ROM medium 499. Depending upon the selected drive and medium, writing on the selected medium as well as reading can be accomplished.

Figure 5:
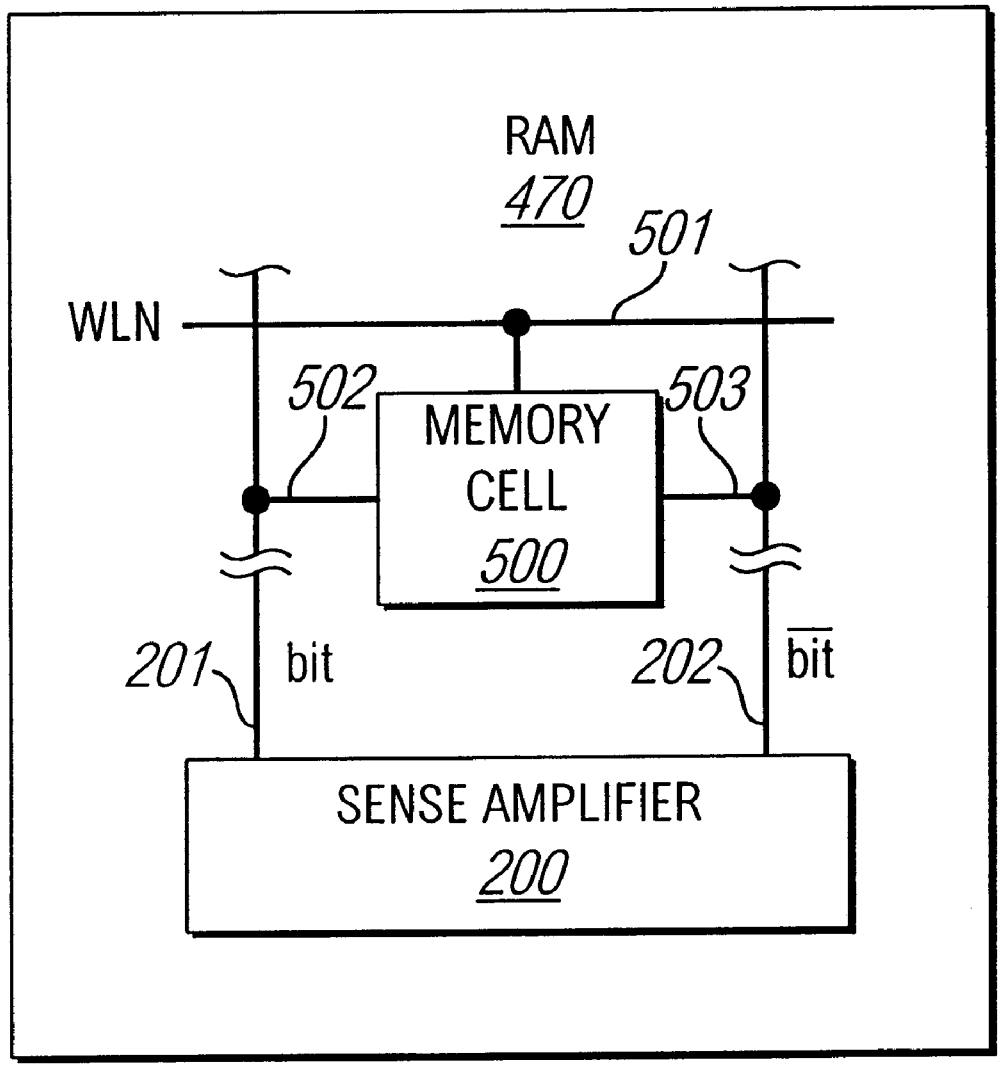
FIG. 5 is a block diagram of a random access memory (RAM) including a differential sense amplifier (DSA) according to the present invention.

Referring now to FIG. 5, there is shown a block diagram of a random access memory (RAM) 470 including a differential sense amplifier system (DSAS) 200 according to the present invention. In particular, differential sense amplifier system 200 according to the present invention, includes at least a single memory cell 500, first and second complementary bitlines, bit and $\overline{\text{bit}}$, respectively 201 and 202, and an n-th wordline, WLN, connected to memory cell 500 which in turn is connected to respective complementary bitlines 201 and 202. When a particular wordline 501 is decoded or addressed, the selected memory cell 501 associated with a particular portion of the word stored between particular complementary bitlines provides its logical state to respective bitlines 201 and 203 over adjacent connection leads 502 and 503, respectively.

In operation, as a bitline begins to discharge, transistors P2 and P4 in FIG. 1D are both on while rise to Vdd, clamping com transistors N1 and N4 are both off. The differential nodes diff and $\overline{\text{diff}}$ are initially low. As P1 begins to turn on, node $\overline{\text{diff}}$ begins to charge unabated by any ground current. Differential node $\overline{\text{diff}}$ then begins to force complementary node diff to ground through transistor N3. Stage 1 of the SAS carries no through current during this entire operation. The same power is dissipated irrespective of whether the bitlines bit or $\overline{\text{bit}}$ are high or low or whether transistors P1 and P2 are on or off, because transistors P1, P2, P3, P4, N1, N4, N2, and N3 are all sized substantially identically. As $\overline{\text{diff}}$ reaches vdd, gate NOR1 causes saout to go low. Output node lat is initially 1 (i.e., high), and the output node $\overline{\text{lat}}$ is initially 0 (i.e., low). Transistors N7 and P5 are initially on, and transistors N6 and P6 are initially off. Transistors N5 and N8 are initially off, with differential nodes diff and $\overline{\text{diff}}$ both being low. As $\overline{\text{diff}}$ reaches Vdd, transistor N5 turns on, discharging node lat to zero volts, which causes transistor P6 to turn on, and charging node $\overline{\text{lat}}$ to Vdd. Some switching current results from toggling this latch; however, this is minimized according to the present invention by properly sizing the P5 and P6 transistors to be substantially identically sized. When $\overline{\text{diff}}$ reaches Vdd, transistor N9 turns on, discharging node $\overline{\text{done}}$, as a result of sense-amp resolution. As suggested in FIG. 2, when node $\overline{\text{done}}$ goes low, node EN is caused also to go low. As suggested in FIG. 3, EN going low causes all wordlines to go low, which disconnects all random access memory bit cells from the bitlines, preventing further power consumption. As the read signal goes to zero, both differential nodes diff and $\overline{\text{diff}}$ return to zero, as transistors N1 and N4 turn on. As a result, transistors N5 and N8 turn off, and the cross coupled inverter formed by transistors P5, P6, N6, and N7 maintains its value during read operation. Since both bitlines bit and bit begin at a precharged value of Vdd, both transistors P1 and P2 are initially off. If the input signal read is initially low, both N1 and N4 are on, while P3 and P4 are both off. This causes both differential nodes diff and $\overline{\text{diff}}$ to be low initially, and zero current is consequently dissipated in stage 1 of the sense amplifier. Since both differential nodes diff and $\overline{\text{diff}}$ are low initially and both N5 and N8 are thus initially off, and transistors P5, P6, N6, and N7 form a cross coupled inverter pair, the sense-amp latch, and nodes lat and $\overline{\text{lat}}$ pass through gates OR1 and OR2, creating buffered versions of the true and complemented forms of the sense amp outputs saout and $\overline{\text{saout}}$. In this state, a zero static current sinks through stage 2 of the amplifier according to the present invention. Transistors N9 and N10 are further off as a result of differential nodes $\overline{\text{diff}}$ and diff both being low. Thus, the $\overline{\text{done}}$ line is at high impedance and is precharged according to one embodiment of the present invention to Vdd as suggested in FIG. 2. At the start of the read operation, the read signal transitions from 0 to Vdd, causing signal EN of FIGS. 2A and 2B to reach Vdd, which in turn allows the wordlines (wl) to turn on. As the particular wordline becomes Vdd, one of the bitlines bit or $\overline{\text{bit}}$ begins to discharge to ground, while the other bitline remains high. For example, with the following initial conditions:

bit=1→0

$\overline{\text{bit}}$=1
$\overline{\text{diff}}$=0
diff=0
lat=1
$\overline{\text{lat}}$=0

Once a read operation is initiated, stage 1 of the amplifier according to the present invention experiences power consumption associated with the discharge of capacitors, but it suffers no through current power consumption. Stage 2 of the amplifier only sinks current during an operation that would cause its stored value to toggle between logical states (i.e., 1→0 or 0→1). When a new state value corresponds to an old stored value (0→0, 1→1), no power is dissipated. This occurs roughly 50% of the time. Consequently, power consumption according to the present invention is greatly reduced for applications in which output read data sees a large capacitance. Since the bitlines are disconnected from the bit cell by disconnecting the wordline as soon as the read is complete, there is no dc component of power dissipation in the amplifier according to the present invention.

What is claimed is:

1. A bitline decoder connected to a complementary pair of bitlines of a semiconductor memory carrying selected information in particular memory cells, said decoder comprising:

first and second control circuits (CCs) respectively connected to said first and second complementary bitlines and to a first voltage;

first and second nodes respectively connected to said first and second CCs, said first and second CCs controlling the application of a first voltage according to logical states sensed on respective ones of said bitlines;

first and second cross-coupled circuits (XCs) respectively connected to said first and second CCs at said respective first and second nodes, said first and second XCs producing corresponding first and second output signals representative of information in particular cells of a semiconductor memory; and a done line and first and second control circuits connected to said done line and respectively controlled by said first and second nodes.

2. The bitline decoder according to claim 1 wherein said first and second CCs are respectively transistors connected to said first and second nodes.

3. The bitline decoder according to claim 2 comprising:

first and second pairs of series connected (SC) transistors, the first pair of SC transistors including a first series transistor (ST) and a second ST and said second pair of SC transistors including a third and fourth ST;

first and second differential nodes (DNs) respectively connected to said first and second pairs of SC transistors;

first and second pairs of parallel connected (PC) transistors connected respectively between said first and second DNs and ground, said first pair of PC transistors including a first parallel transistor (PT) and a second PT and said second pair of PC transistors including a third and fourth PT;

third and fourth pairs of PC transistors, said third pair of PC transistors including a fifth and a sixth PT, wherein said first DN controls a selected PT of said third pair of PC transistors and said second DN controls a selected PT of said fourth pair of PC transistors.

4. The bitline decoder according to claim 1 comprising:

first and second pairs of series connected (SC) transistors, the first pair of SC transistors including a first series transistor (ST) and a second ST and said second pair of SC transistors including a third and fourth ST;

first and second differential nodes (DNs) respectively connected to said first and second pairs of SC transistors;

first and second pairs of parallel connected (PC) transistors connected respectively between said first and second DNs and ground, said first pair of PC transistors including a first parallel transistor (PT) and a second PT and said second pair of PC transistors including a third and fourth PT;

third and fourth pairs of PC transistors, said third pair of PC transistors including a fifth and a sixth PT, wherein said first DN controls a selected PT of said third pair of PC transistors and said second DN controls a selected PT of said fourth pair of PC transistors.

5. The bitline decoder according to claim 4 wherein selected ones of said SC transistors are controlled respectively by associated bit and read lines.

6. The bitline decoder according to claim 5 wherein the logical states of selected ones of said PTs are controlled by opposite ones of said DNs.

7. The bitline decoder according to claim 6 wherein other ones of said PTs are controlled by a read line which activates operation of the other PTs to enable performance of read operations.

8. The bitline decoder according to claim 4 including a fifth and a sixth ST and said fourth pair of PC transistors including a seventh and an eighth PT, wherein said fifth ST is connected to said third pair of PC transistors at a first output node and said sixth ST is connected to said fourth pair of PC transistors at a second output node.

9. The bitline decoder according to claim 8 wherein said first output node controls a selected PT of said fourth pair of PC transistors and said second output node controls a selected PT of said third pair of PC transistors.

10. The bitline decoder according to claim 8 further comprising first and second logic gates (LGs) respectively input connected to first and second output nodes.

11. The bitline decoder according to claim 10 wherein said first and second LGs are respectively input connected to said first and second DNs.

12. The bitline decoder according to claim 8 including a done line and first and second control transistors connected to said done line and respectively controlled by said first and second DNs.

13. A bitline decoder connected to a complementary pair of bitlines of a semiconductor memory carrying selected information in particular memory cells, said decoder comprising:

first and second pairs of series connected (SC) transistors, the first pair of SC transistors including a first series transistor (ST) and a second ST and said second pair of SC transistors including a third and fourth ST;

first and second differential nodes (DNs) respectively connected to said first and second pairs of SC transistors;

first and second pairs of parallel connected (PC) transistors connected respectively between said first and second DNs and ground, said first pair of PC transistors including a first parallel transistor (PT) and a second PT and said second pair of PC transistors including a third and fourth PT;

third and fourth pairs of PC transistors, said third pair of PC transistors including a fifth and a sixth PT; and first and second logic gates (LGs) respectively input connected to first and second output nodes.

14. The bitline decoder according to claim 13 wherein said first and second LGs are respectively input connected to said first and second DNs.

15. The bitline decoder according to claim 13 including a done line and first and second control transistors connected to said done line and respectively controlled by said first and second DNs.

* * * * *